United States Patent
Ko et al.

(10) Patent No.: US 7,307,880 B2
(45) Date of Patent: Dec. 11, 2007

(54) ONE TIME PROGRAMMING MEMORY CELL USING MOS DEVICE

(75) Inventors: Chin-Yuan Ko, Hsinchu (TW); Yung-Sheng Tsai, Hsinchu (TW); Pei-Chun Liao, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 11/272,657

(22) Filed: Nov. 14, 2005

(65) Prior Publication Data

US 2007/0109852 A1    May 17, 2007

(51) Int. Cl.
*G11C 11/34*    (2006.01)
(52) U.S. Cl. ............ 365/185.05; 365/185.04; 365/185.14; 365/185.26; 365/185.18
(58) Field of Classification Search ........... 365/185.05, 365/185.14, 185.04, 185.18, 185.26
See application file for complete search history.

(56) References Cited

U.S. PATENT DOCUMENTS 5,155,701 A * 10/1992 Komori et al. ........ 365/185.23
6,956,258 B2 * 10/2005 Peng .......................... 257/298

OTHER PUBLICATIONS

Suehle, J. S., et al., "Ultrathin Gate Oxide Reliability: Physical Models, Statistics, and Characterization," IEEE Transactions on Electron Devices, vo. 49, No. 6, Jun. 2002, pp. 958-971.
Carter, J. R., et al., "Circuit-Level Modeling for Concurrent Testing of Operational Defects due to Gate Oxide Breakdown," appears in the Proceedings of the 2005 Design, Automation, and Test in Europe (DATE), Munich, Germany, Mar. 7-11, 2005, http://www.ee.duke.edu/~sorin/papers/date05_model.pdf.

* cited by examiner

*Primary Examiner*—Son Dinh
*Assistant Examiner*—Pho M. Luu
(74) *Attorney, Agent, or Firm*—Slater & Matsil, L.L.P.

(57) ABSTRACT

An electroless plating apparatus is provided. The electroless plating apparatus includes a wafer holder; a chemical dispensing nozzle over the wafer holder; a conduit connected to the chemical dispensing nozzle; and a radiation source over the wafer holder.

22 Claims, 8 Drawing Sheets

ONE TIME PROGRAMMING MEMORY CELL USING MOS DEVICE

TECHNICAL FIELD

This invention relates to one time programming memory cells, and more particularly to memory cells formed based on a soft breakdown mechanism.

BACKGROUND

With the increasing scaling of integrated circuits, metal-oxide-semiconductor (MOS) devices become increasingly smaller. Gate oxides, sometimes referred to as gate dielectrics, in MOS devices become thinner accordingly. This increases the possibility of certain side effects.

In a newly manufactured MOS device, there is a random number of traps in the gate oxide. Over time, due to operational stress, more traps form, leading to small transient conductive paths through the oxide. During this process, current conduction is caused by a combination of conductive paths formed by oxide traps and tunneling through the oxide. The formation of these conductive paths is referred to as soft breakdown (SBD). These conductive paths may become fixed by a high current density that causes a high temperature at the defect location. High temperature may alternatively relocate some of the oxide traps, breaking the conductive path. However, under normal operating conditions, soft breakdown persists. After a number of SBD incidents, many traps exist within the oxide, leading to a consistently high current density. Eventually, the resulting heat may generate holes in the oxide and melt the conductive materials at the gate. Thus, a persistent low-resistance path is formed, leading to a hard breakdown (HBD).

Both soft breakdown and hard breakdown are irreversible under normal device operating conditions. Hard breakdown will cause the device to malfunction, resulting in integrated circuit failure. A device experiencing soft breakdown, on the other hand, may still function correctly. However, a device experiencing soft breakdown will draw an excessive leakage current, and may lead to hard breakdown. Therefore, previous researchers have treated soft breakdown as an undesirable effect and have concentrated on how to eliminate or at least reduce soft breakdown.

The preferred embodiments of the present invention provide a new approach for researching and using the soft breakdown mechanism.

SUMMARY OF THE INVENTION

A non-volatile memory cell based on a soft breakdown mechanism and capable of one time programming is provided.

In accordance with one aspect of the present invention, a preferred memory cell includes a resistor coupled in series to a MOS device. With the resistor connected, soft breakdown can reliably occur when the MOS device is electrically stressed. Leakage current flowing through the gate dielectric increases after soft breakdown. Different levels of leakage currents are used to indicate different states of the memory cell. The source and drain regions of the MOS device are preferably shorted; thus the MOS device acts as a capacitor.

In accordance with another aspect of the present invention, the memory cell is preferably connected to a program pin and a read pin, which are external to the chip in which the memory cell is formed.

In accordance with yet another aspect of the present invention, a memory array includes memory cells arranged in a plurality of rows and a plurality of columns. A plurality of word-lines are respectively connected to the rows of memory cells with each respective word-line connected to the memory cells of each respective row. A plurality of bit-lines are respectively connected to the columns of memory cells with each respective bit-line connected to the memory cells of each respective column. Each memory cell comprises a MOS device adapted to soft breakdown. The MOS devices in a same row (or a same column) may share a common resistor. Each respective row (or column) is preferably coupled to a program pin and a read pin.

In accordance with yet another aspect of the present invention, a program operation of the preferred embodiments of the present invention includes applying a program voltage to a gate of a MOS device through a resistor and incurring a soft breakdown. The program voltage is preferably higher than the normal operation voltage of the integrated circuit. Preferably, the program operation is performed in a short period of time, and the required program voltage can be estimated based on calculation.

In accordance with yet another aspect of the present invention, a read operation of the preferred embodiments of the present invention includes applying a reading voltage and measuring a leakage current through the gate oxide. A reference MOS device is preferably used to determine the state of the memory cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
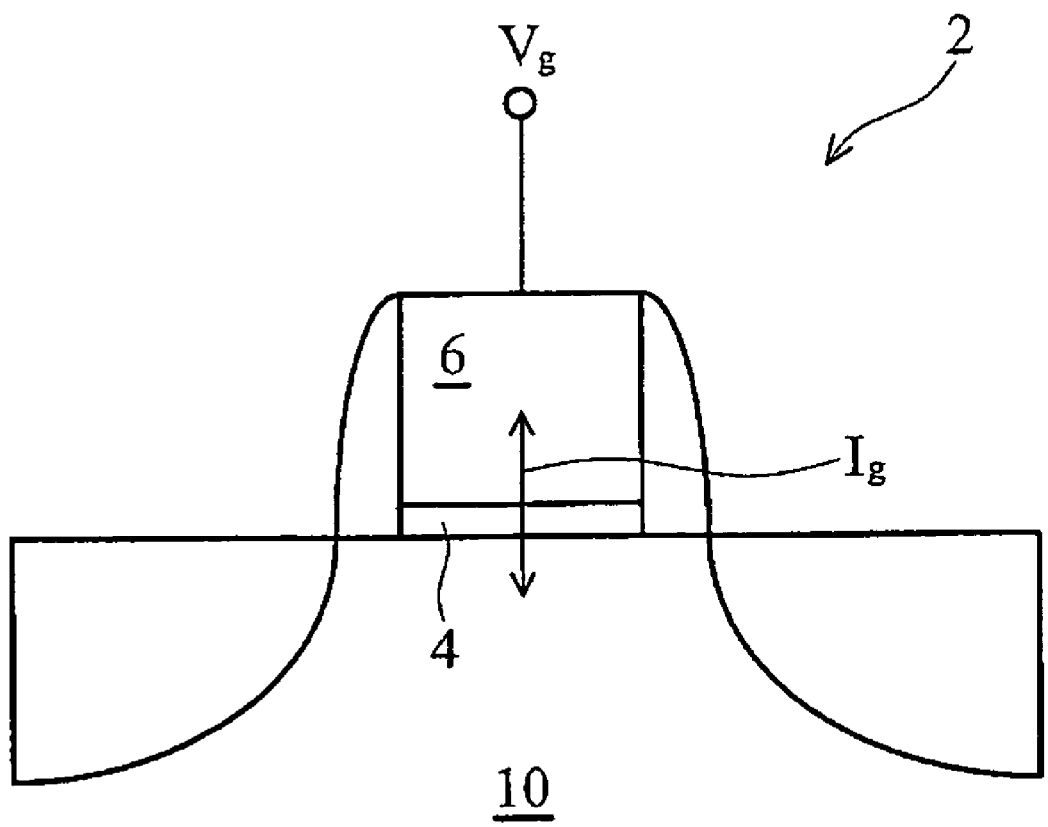
FIG. 1 illustrates a prior art MOS device having a leakage current.

FIG. 1 illustrates a conventional MOS device 2, which includes a gate dielectric 4 (sometimes referred to as a gate oxide 4) formed on a substrate 10 and a gate electrode 6 on the gate dielectric 4. During operation, a gate voltage $V_g$ is applied to the gate electrode 6. Typically, there is a small leakage current $I_g$ flowing through the gate dielectric 4. For small-scaled MOS devices, for example, MOS devices manufactured using 130 nm technology or below, the leakage current $I_g$ is typically in an order of nano amps.

Figure 2:
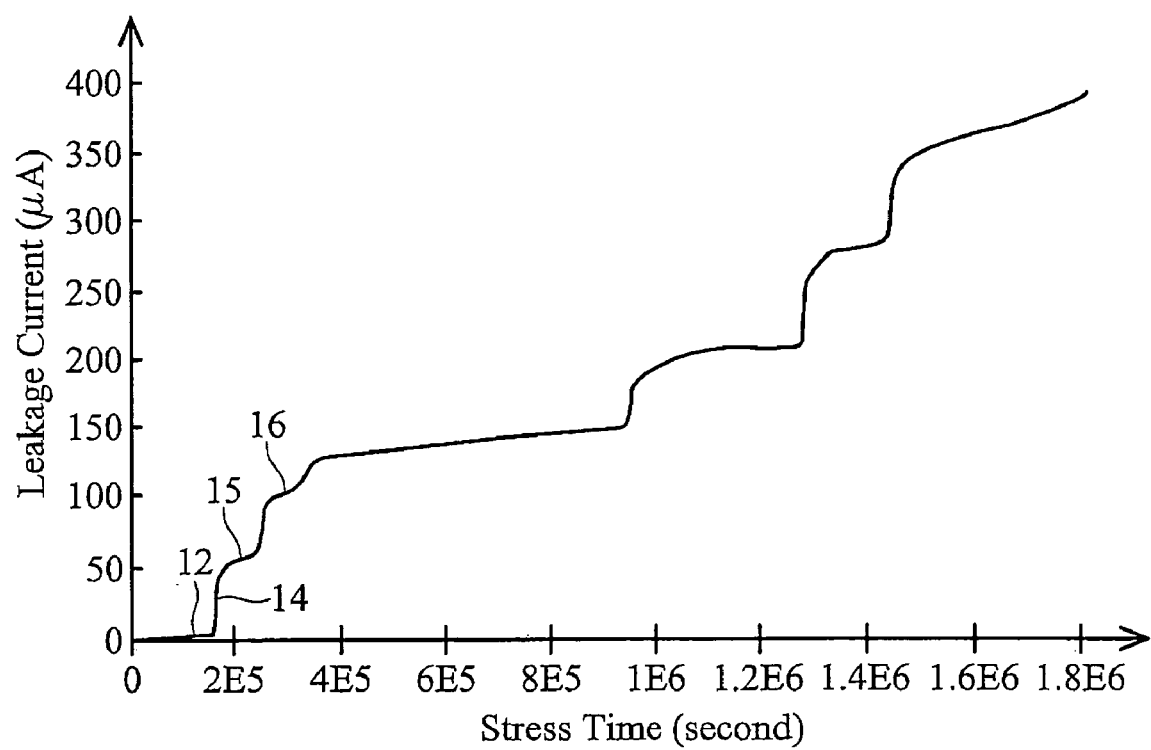
FIG. 2 illustrates a leakage current as a function of stress time in a PMOS device, wherein multiple soft breakdowns are shown.

Soft breakdown or hard breakdown may occur when MOS devices are electrically stressed, resulting in a significant increase in leakage current $I_g$. FIG. 2 illustrates how a leakage current $I_g$ increases over time on a sample PMOS device. The PMOS device is stressed by a gate voltage at about −3.56V. Before being stressed, the sample device has a very small leakage current (point 12). The leakage current $I_g$ increases to about 60 µA after a soft breakdown occurs (point 14). The leakage current $I_g$ stays relatively stable for a period of time before another soft breakdown occurs, thus a step (level) 15 is formed. The second breakdown causes leakage current $I_g$ to increase to a higher level (point 16). Over time, more soft breakdowns may occur.

Since devices have different leakage currents before and after breakdown, a memory device can be formed using the soft breakdown mechanism, wherein different states can be represented by different magnitudes of the leakage currents. Since soft breakdown is un-recoverable, the resulting memory devices are non-volatile. For example, a MOS device having no soft breakdown may be used to store a state "0," while a MOS device having soft breakdown may be used to store a state "1."

Soft breakdown, however, has been found to be an unreliable mechanism. It is likely that a hard breakdown occurs before any noticeable soft breakdown. This prevents the use of the soft breakdown to form a reliable device. The occurrence of soft breakdown is often found to be a probability affected by various factors. For example, the occurrence of soft breakdown is related to the size of MOS devices. Research has revealed the following results. For a sample MOS device having a channel length of 0.12 µm, the probability of having a hard breakdown is almost one hundred percent when the MOS device is electrically stressed. If the channel length increases to about 0.24 µm, the probability of having a hard breakdown is about 70 percent, and the probability of having one or more soft breakdown increases to about 30 percent. When the channel length is further increased to about 0.5 µm, about 1.2 µm and about 10 µm, the probability of having soft breakdown(s) increases to about 55 percent, 70 percent and 88 percent, respectively.

Advantageously, a memory cell based on a soft breakdown mechanism should have an improved probability that soft breakdown can reliably occur, and thus the memory cell can be reliably programmed to a soft breakdown state without causing a hard breakdown. A solution is provided by the preferred embodiments of the present invention, as shown in FIGS. 3A through 7, wherein like reference numbers are used to identify like elements.

Figure 3A:
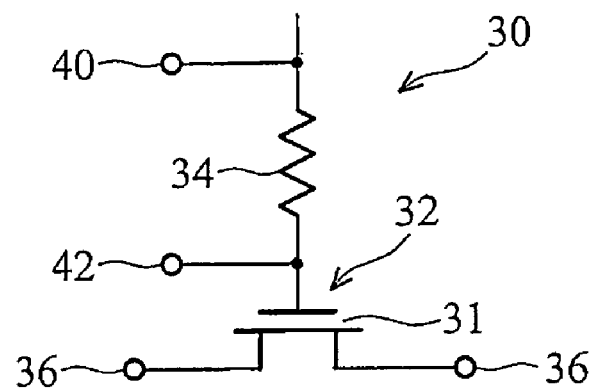
FIGS. 3A through 3D are variations of the preferred embodiment of the present invention.

Referring to FIG. 3A, a memory cell 30 includes a resistor 34 coupled in series with a MOS device 31. Throughout the description, the terms "series" or "serially" are used to refer to the connection or coupling between a resistor and a MOS device, indicating that the resistor connects/couples either to the gate of the MOS device, or to both source and drain regions of the MOS device. The MOS device 31 is adapted to soft breakdown. More preferably, MOS device 31 is a PMOS device, as soft breakdowns are more likely to occur on a PMOS device. However, an NMOS device can also be used. Due to the modulation of the resistor 34, the program operation of the memory cell 30 can be reliably controlled without causing a hard breakdown.

Figure 3B:
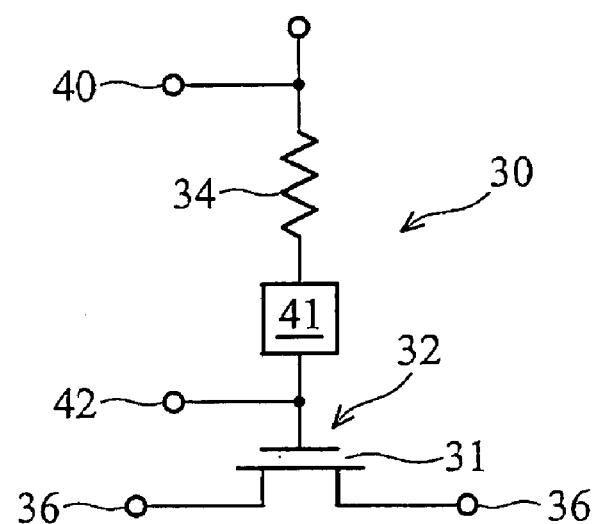
Figure 3C:
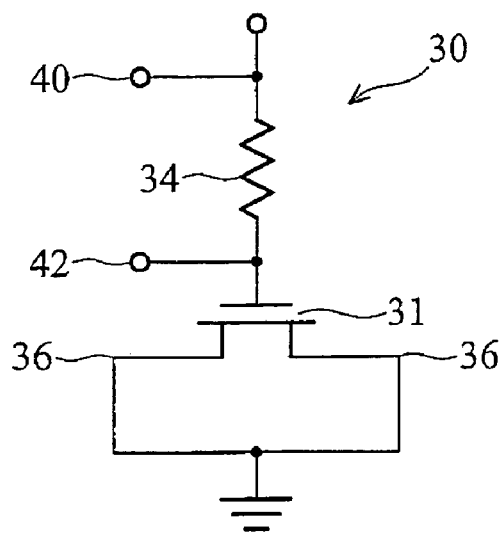
Figure 3D:
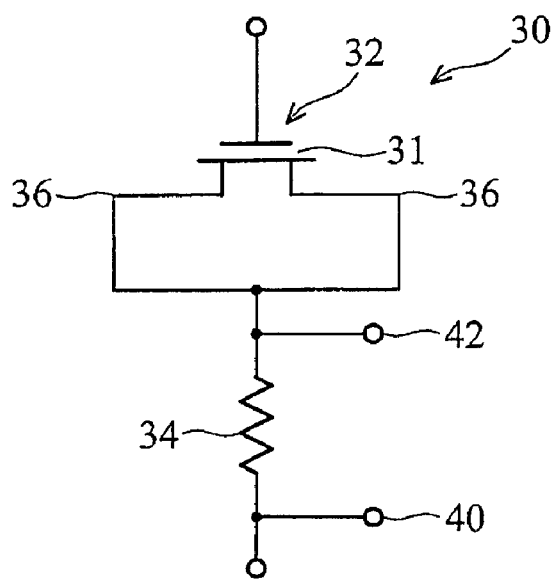

In the preferred embodiment, as shown in FIG. 3A, the resistor 34 is directly connected to the gate 32 of the MOS device 31 by interconnections such as conductive lines, vias and contacts. In other embodiments, as shown in FIG. 3B, the resistor 34 and the gate 32 of the transistor 30 includes other conductive feature(s) 41 in between, wherein substantially the same current flows through the resistor 34 and the gate 32. Preferably, source and drain regions 36 of the MOS device 31 are interconnected, as shown in FIG. 3C. During program or read operations, the source and drain regions 36 are preferably grounded. The resistor 34 may also be connected serially to the source and drain regions 36, as shown in FIG. 3D. It is noted that when source and drain regions 36 are interconnected, the MOS device 31 acts as a capacitor. Therefore, the preferred embodiments of the present invention also include forming a non-volatile memory cell by serially coupling a semiconductor capacitor and a resistor. In the preferred embodiment, the memory cells shown in FIG. 3A through 3D are coupled to program pins 40 and read pins 42, which are external pins used for programming and reading. In other embodiments, read and program operations share a common pin 40. In yet other embodiments, program and read pins are internal pins and external signals are communicated via other intermediary circuitry (not shown).

Figure 4A:
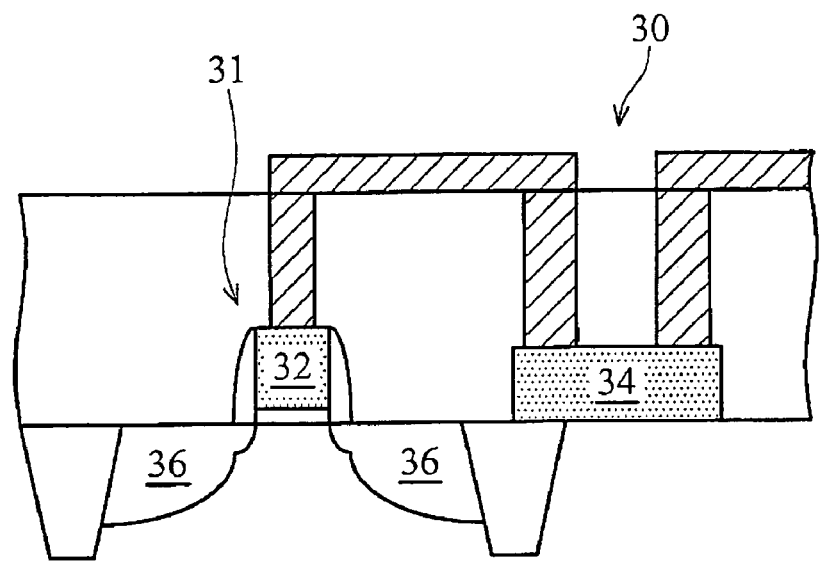
FIGS. 4A and 4B are cross-sectional views of the preferred embodiment of the present invention.
Figure 4B:
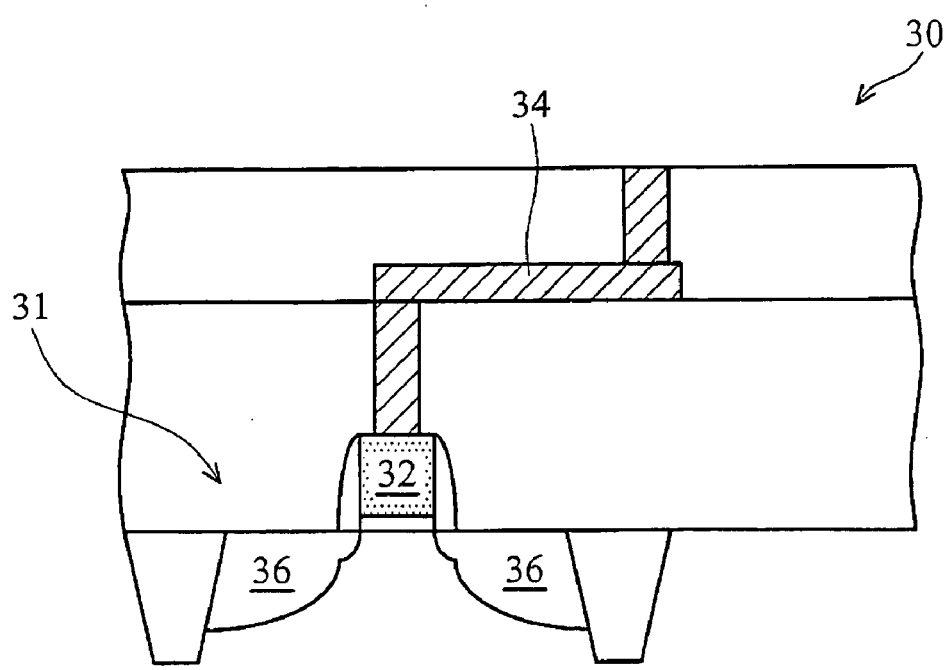

The resistor 34 preferably has a resistance between about 5 k ohm and about 10 M ohm, and more preferably between about 50 k ohm and about 1 M ohm, and can be formed using methods and structures known in the art. FIG. 4A illustrates a cross-sectional view of an exemplary embodiment, wherein the resistor 34 is formed of a poly-silicon line. Poly-silicon lines, depending on the doping concentration, may have a wide range of resistivity, and therefore are suitable for forming resistors. FIG. 4B illustrates another embodiment, wherein the resistor 34 is formed of a metal line in a metallization layer.

During a program operation, a program voltage $V_p$ is applied to program pin 40 (refer to FIGS. 3A through 3D). The program voltage $V_p$ is preferably higher than the operation voltage of the integrated circuit. The gate dielectric of the MOS device 31 is stressed by the voltage $V_p$ and a soft breakdown occurs. Resistor 34 attenuates the leakage current and prevents any leakage current pulse that may cause hard breakdown.

A program operation requires determining an appropriate program voltage and an appropriate program time, which can be found through routine experiments by applying a program voltage and measuring a resulting leakage current. The preferred embodiments of the present invention further provide a method to determine an appropriate program voltage for a pre-determined program time. It is known that a program time $T_{BD}$, which is the time used to incur a soft breakdown, relates to the program voltage $V_p$, and a shorter program time is needed if a higher program voltage is applied. A relationship between the program time $T_{BD}$ and the program voltage $V_p$ can be expressed as:

$$T_{BD} = \tau_0 * V_p^{-n} \qquad [\text{Eq. 1}]$$

wherein $\tau_0$ and n are related to the characteristics of the MOS device 31, such as dimensions and materials. Since n is high, typically about 40, when program voltage $V_p$ increases, the required program time $T_{BD}$ decreases dramatically. This leads to favorable results. Firstly, a program operation can be performed quickly using a high program voltage. Secondly, when operated under a low operation voltage during normal read operations, the preferred embodiments of the present invention are very stable.

Preferably, the pre-determined program time $T_p$ is substantially less than about one milli-second in order to quickly program multiple memory cells. To find the corresponding program voltage, a first voltage $V_{p1}$ is applied to stress the memory cell, and a first program time $T_1$ is measured. The first program time $T_1$ is preferably longer than the pre-determined program time $T_p$ for a more accurate measurement of time. Accordingly, a lower first program voltage $V_p$ is selected. The required program voltage $V_p$ can then be derived from the following equations:

$$T_1 = \tau_0 * V_{p1}^{-n} \quad \text{[Eq. 2]}$$

$$\text{and } T_p = \tau_0 * V_p^{-n} \quad \text{[Eq. 3]}$$

From Equations 2 and 3, it is found that:

$$V_p = e^{(\ln V_{p1} + (\ln T_1 - \ln T_p)/n)} \quad \text{[Eq. 4]}$$

Therefore, an appropriate program voltage $V_p$ is found, and the memory device can be programmed by applying the program voltage $V_p$ for the period of time $T_p$. It is to be appreciated that the previous discussion gives an estimation. To further improve accuracy of the program operations, routine experiments may be combined with the previously discussed method to find the optimum program voltage and time.

For reading a memory cell, a read voltage, which is preferably substantially lower than the program voltage, is applied to the read pin 42 of the memory cell and a leakage current is measured. If the leakage current indicates that the memory cell 30 has a soft breakdown, the memory cell is known to be in a programmed state, for example, state "1." Otherwise, the memory cell is in an un-programmed state, such as state "0."

Figure 5A:
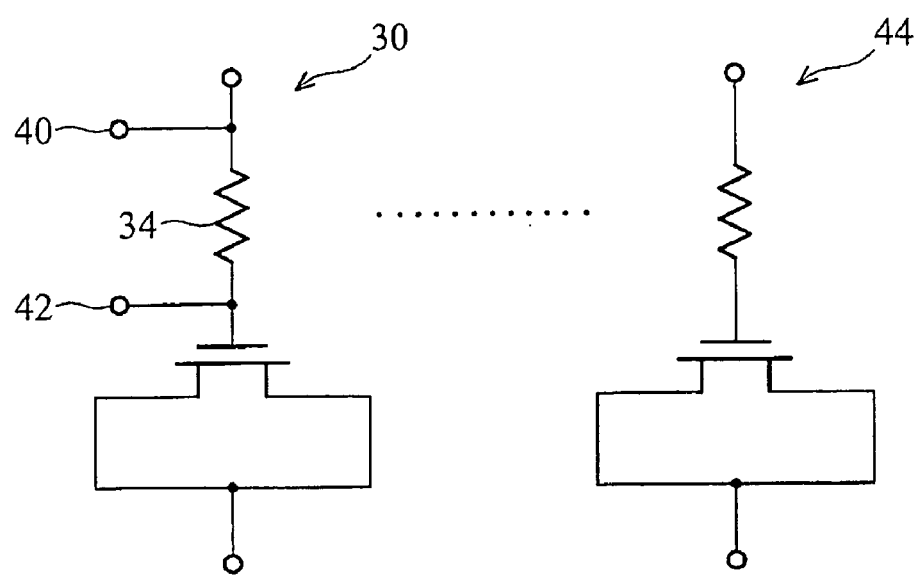
FIGS. 5A and 5B illustrate a reference memory cell used for determining a state of a memory cell.

Obviously, leakage currents will be different if the memory cells are formed with different sizes, materials and/or processes. A reference memory cell 44, which is preferably substantially identical to the memory cell 30, is therefore preferably formed for comparison purposes, as shown in FIG. 5A. The reference memory cell 44 is preferably formed simultaneously and identically to memory cell 30. In the preferred embodiment, the reference memory cell 44 is not programmed. With a same read voltage applied, if a leakage current of the memory cell 30 is significantly greater than that of the reference memory cell 44, it is known that memory cell 30 has been programmed. On the contrary, if a leakage current of a memory cell 30 is substantially close to that of the reference memory cell 44, the memory cell is un-programmed.

Figure 5B:
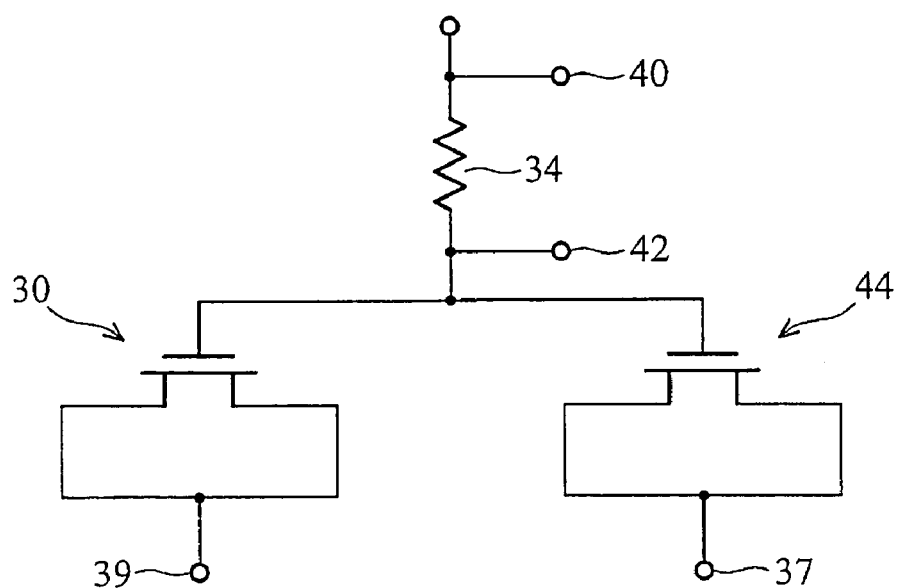

In alternative embodiments, the reference memory cell 44 is pre-programmed. At read time, if a leakage current of the memory cell 30 is substantially close to that of the reference memory cell 44, the memory cell 30 is programmed. An un-programmed memory cell 30 provides a substantially smaller leakage current then the reference memory cell 44. FIG. 5B illustrates a variation of the diagram shown in FIG. 5A, wherein the reference memory cell 44 shares a common resistor 34 with the memory cell 30. A read voltage is applied on read point 42. If node 39 is grounded while node 37 is floating, the memory cell 30 is read. Conversely, if node 37 is grounded while node 39 is floating, the reference memory cell 44 is read.

Figure 6:
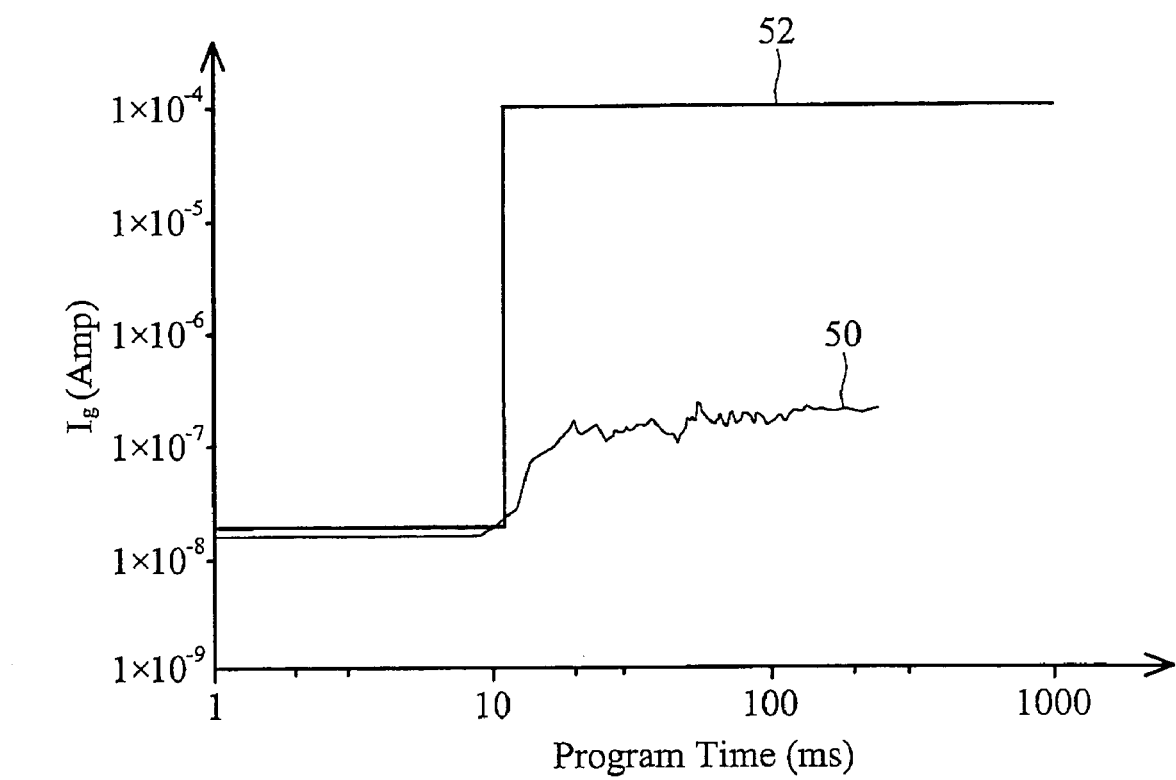
FIG. 6 illustrates a result obtained from a preferred memory cell embodiment, wherein a leakage current in the gate dielectric is shown as a function of a program time.

FIG. 6 illustrates an exemplary program operation, wherein a leakage current is shown as a function of program time. Line 50 shows an experimental result obtained from the preferred embodiment of the present invention. It is found that the leakage current $I_g$ of the preferred embodiment rises from about $2 \times 10^{-8}$ amps before programming to over about $1 \times 10^{-7}$ amps after programming. If a memory cell with no resistor is programmed, as line 52 shows, however, the leakage current jumps from $2 \times 10^{-8}$ amps to over $1 \times 10^{-4}$ amps, and a hard breakdown occurs.

FIG. 6 indicates that soft breakdown is a more favorable mechanism for building a memory cell than hard breakdown. Memory cells having soft breakdown draw lower leakage currents, thus consuming less power than memory cells formed based on hard breakdown. A memory chip formed based on soft breakdown may thus contain more memory cells.

Figure 7:
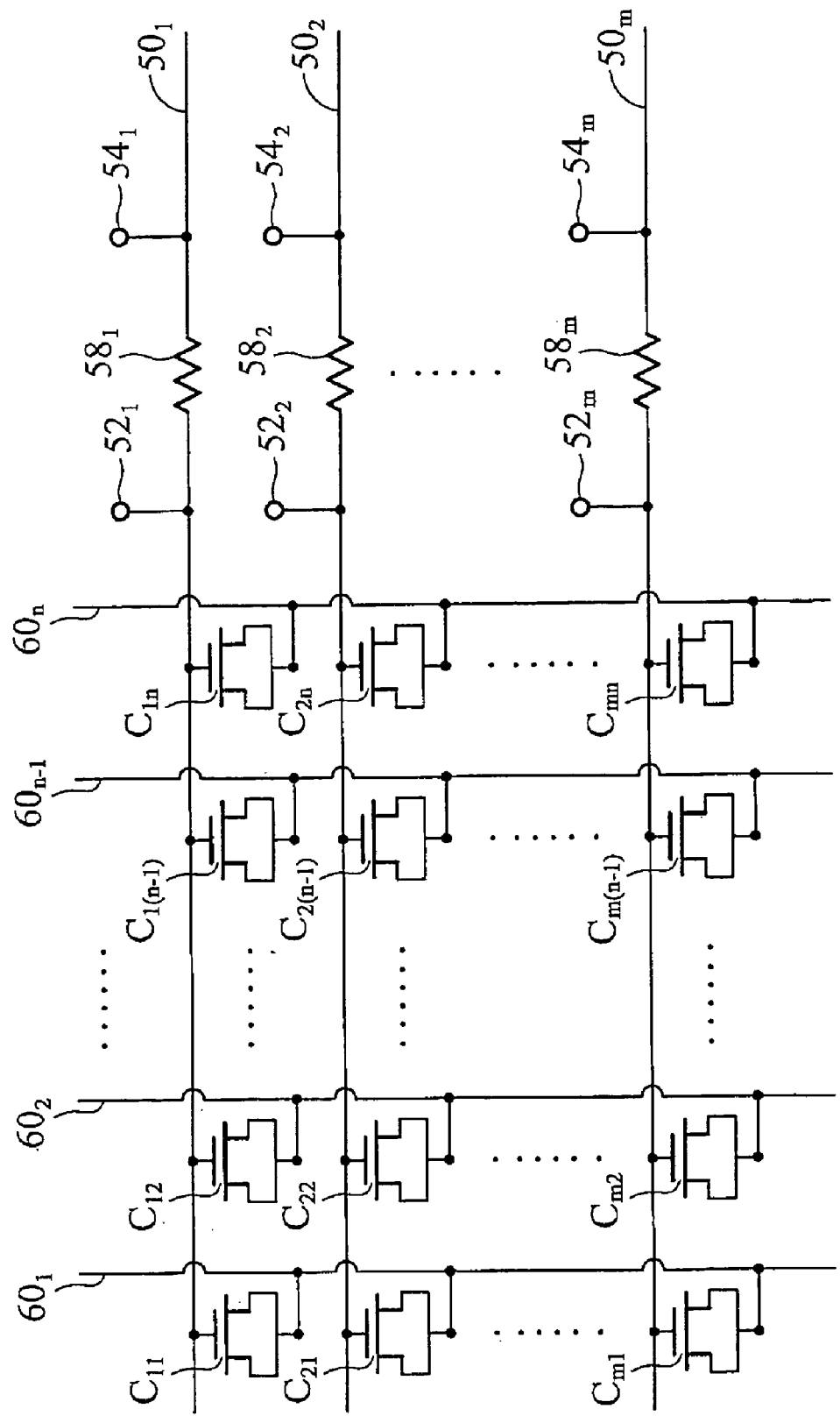
FIG. 7 illustrates a memory cell array formed of the preferred memory cell embodiment.

The preferred embodiments of the present invention may be used to form memory arrays. FIG. 7 schematically illustrates a memory array, which comprises rows (sometimes referred to as words) $50_1, 50_2, \ldots, 50_m$ and columns (sometimes referred to as bits) $60_1, 60_2, \ldots, 60_n$. Each row preferably shares a read pin and a program pin. Note that the memory cells in a row share a resistor. This not only saves chip area, but the deviation between the induced leakage current for the memory cells is also reduced. If a memory cell $C_{jk}$ (wherein j is between 1 and m, and k is between 1 and n) is selected for programming, a programming voltage is applied to the respective program pin $54_j$, and the respective column $60_k$ is connected to a lower voltage potential such as ground. Remaining rows and columns are preferably floating. Similarly, if a selected memory cell $C_{jk}$ is selected for reading, a read voltage is applied to the respective read pin $52_j$, and the respective column $60_k$ is connected to a low potential. Remaining rows and columns are preferably floating. A leakage current between read pin $52_j$ and bit line $60_k$ is read to determine the state of the memory cell $C_{jk}$. It is understood that memory cells in the array may be connected in different ways. For example, resistors $58_1$ through $58_m$ (and respective program pins $52_1$ through $52_m$ and read pins $54_1$ through $54_m$) may be connected to columns instead of rows. Also, rows and columns can be reversed.

Due to the limitation of the relatively high leakage current, the preferred embodiments of the present invention are suitable for, but not limited to, building low density memories, such as memories for storing security code, chip ID, and the like.

The preferred embodiments of the present invention have several advantageous features. Firstly, the fabrication of the preferred embodiments of the present invention is fully compatible with existing semiconductor manufacturing processes. Secondly, since soft breakdown is not recoverable, stored states will not leak over time like some electron-storing memory cells. The preferred embodiments of the present invention are therefore suitable for long time storage.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile memory cell comprising:
   a metal-oxide-semiconductor (MOS) structure comprising a source and a drain, wherein the source and the drain are shorted;
   a resistor serially coupled to the MOS structure; and
   a program pin coupled to a first end of the resistor, the program pin being adapted to be coupled to a sufficient programming voltage to induce soft breakdown in the MOS structure.

2. The non-volatile memory cell of claim 1, wherein the program pin is an external pin, and wherein the resistor further comprises a second end coupled to an external program pin.

3. The non-volatile memory ccli of claim 1, wherein the MOS structure is a PMOS device.

4. The non-volatile memory cell of claim 1, wherein the resistor is directly connected to the MOS structure by conductive interconnections.

5. The non-volatile memory cell of claim 4, wherein the conductive interconnections are selected from the group consisting essentially of conductive lines, vias and contacts.

6. The non-volatile memory cell of claim 1, wherein the resistor has a resistance of between about 5 k ohm and about 10M ohm.

7. The non-volatile memory cell of claim 6, wherein the resistance of the resistor is between about 50 k ohm and about 1M ohm.

8. The non-volatile memory cell of claim 1 further comprising a reference memory cell substantially identical to the non-volatile memory cell, wherein the reference memory cell is used to generate a reference leakage current.

9. The non-volatile memory cell of claim 8, wherein the reference memory cell and the non-volatile memory cell share a common resistor.

10. An array of memory cells arranged in a plurality of rows and a plurality of columns, the array comprising:
    a plurality of first-lines connected to the rows of memory cells of the array with a first-line connected to gates of memory cells in a same row; and
    a plurality of second-lines connected to the columns of memory cells of the array with a second-line connected to a source and a drain of each of memory cells in a same column, wherein each of the memory cells comprises a metal-oxide-semiconductor (MOS) device coupled serially to a resistor, and wherein the MOS device is adapted to a soft breakdown.

11. The array of memory cells of claim 10, wherein the first-lines are word-lines and the second-lines are bit-lines.

12. The array of memory cells of claim 10, wherein the memory cells in a row share a resistor.

13. The array of memory cells of claim 12, wherein the resistor has a first end coupled to a program pin and a second end coupled to a read pin.

14. The semiconductor structure of claim 10, wherein at least one of the MOS devices in one of the memory cells in the array is at a soft breakdown state.

15. The semiconductor structure of claim 10, wherein at least two of the MOS devices in tow of the memory cells in the array are at different levels of soft breakdown states.

16. A device comprising:
    a memory cell including:
      a MOS device having a nominal leakage current state and at least one programmed leakage current state, the programmed leakage current state being greater than the nominal leakage current state and resulting from soft breakdown of a dielectric layer of the MOS device; and
      a resistor serially coupled to the MOS device for attenuating a current through the MOS device resulting from a program voltage.

17. The device of claim 16, wherein the MOS device is a PMOS device.

18. The device of claim 16, wherein the nominal leakage current state and the at least one programmed leakage current state are states of the memory cell.

19. A semiconductor structure comprising:
    a metal-oxide-semiconductor (MOS) device comprising a first source region, and a first drain region shorted to the first source region;
    a resistor serially coupled to the MOS device;
    a voltage source coupled to the resistor; and
    a reference MOS device substantially identical to the MOS device, wherein the reference MOS device comprises a second source region, and a second drain region shorted to the second source region, and wherein the reference MOS device is at a soft breakdown state.

20. The semiconductor structure of claim 19, wherein the resistor is serially coupled to the reference MOS device.

21. The semiconductor structure of claim 19, wherein the MOS device is at a soft breakdown state.

22. The semiconductor structure of claim 19, wherein the MOS device is at a different breakdown level as the reference MOS device.

* * * * *

UNITED STATES PATENT AND TRADEMARK OFFICE
CERTIFICATE OF CORRECTION

PATENT NO. : 7,307,880 B2 Page 1 of 1
APPLICATION NO. : 11/272657
DATED : December 11, 2007
INVENTOR(S) : Ko et al.

It is certified that error appears in the above-identified patent and that said Letters Patent is hereby corrected as shown below:

Col. 5, line 9, delete "$V_p$" and insert --$V_{p1}$--.
Col. 7, line 17 (claim 3), delete "ccli" and insert --cell--.

Signed and Sealed this

Eighth Day of April, 2008

JON W. DUDAS
*Director of the United States Patent and Trademark Office*